United States Patent
Shan et al.

(10) Patent No.: US 8,349,644 B2
(45) Date of Patent: Jan. 8, 2013

(54) MONO-SILICON SOLAR CELLS

(75) Inventors: Wei Shan, Fremont, CA (US); Xiao-Dong Xiang, Danville, CA (US)

(73) Assignee: e-Cube Energy Technologies, Ltd., Saratoga, CA (US)

( * ) Notice: Subject to any disclaimer, the term of this patent is extended or adjusted under 35 U.S.C. 154(b) by 305 days.

(21) Appl. No.: 12/254,316

(22) Filed: Oct. 20, 2008

(65) Prior Publication Data

US 2010/0029039 A1   Feb. 4, 2010

Related U.S. Application Data

(60) Provisional application No. 60/981,108, filed on Oct. 18, 2007, provisional application No. 60/985,624, filed on Nov. 5, 2007, provisional application No. 60/985,627, filed on Nov. 5, 2007.

(51) Int. Cl.
   *H01L 21/00* (2006.01)

(52) U.S. Cl. ........ 438/98; 438/96; 257/E31.034; 257/E31.047; 257/E31.048; 136/261; 136/252; 136/249; 136/243

(58) Field of Classification Search ........ 438/98, 438/96; 136/256; 257/E31.034, E31.047, 257/E31.048
See application file for complete search history.

(56) References Cited

U.S. PATENT DOCUMENTS

| | | | | |
|---|---|---|---|---|
| 4,927,770 A * | 5/1990 | Swanson | .......... | 438/83 |
| 6,844,248 B2 * | 1/2005 | Naseem et al. | .......... | 438/486 |
| 2006/0130891 A1 * | 6/2006 | Carlson | .......... | 136/256 |
| 2009/0283141 A1 * | 11/2009 | Bentzen et al. | .......... | 136/256 |
| 2010/0013090 A1 * | 1/2010 | Gerritsen et al. | .......... | 257/734 |
| 2010/0024865 A1 * | 2/2010 | Shah et al. | .......... | 136/244 |
| 2010/0032011 A1 * | 2/2010 | Sauar | .......... | 136/256 |

FOREIGN PATENT DOCUMENTS

| | | |
|---|---|---|
| JP | 56-051878 A | 5/1981 |
| JP | 56-093376 A | 7/1981 |
| JP | 01-253282 A | 10/1989 |
| JP | 04-127482 A | 4/1992 |
| WO | WO/2009/052511 | 4/2009 |

OTHER PUBLICATIONS

PCT International Search Report and Written Opinion dated May 29, 2009 issued in WO2009/052511 [PCT/US2008/080525].
PCT International Preliminary Report on Patentability dated Apr. 20, 2010 issued in WO2009/052511 [PCT/US2008/080525].

* cited by examiner

*Primary Examiner* — Ha Tran T Nguyen
*Assistant Examiner* — Aaron Dehne
(74) *Attorney, Agent, or Firm* — Tom Hunter; Weaver Austin Villeneuve & Sampson LLP

(57) ABSTRACT

A method for producing a backside contact of a single p-n junction photovoltaic solar cell is provided. The method includes the steps of: providing a p-type substrate having a back surface; providing a plurality of p+ diffusion regions at the back surface of the substrate; providing a plurality of n+ diffusion regions at the back surface of the substrate in an alternate pattern with the p+ diffusion regions; providing an oxide layer over the p+ and n+ regions; providing an insulating layer over the back surface of the substrate; providing at least one first metal contact at the back surface for the p+ diffusion regions; and providing at least one second metal contact at the back surface for the n+ diffusion regions.

2 Claims, 12 Drawing Sheets

400

500

MONO-SILICON SOLAR CELLS

CROSS-REFERENCE TO RELATED APPLICATIONS

This application claims priority to U.S. Provisional Patent Application Ser. Nos. 60/981,108 filed Oct. 18, 2007, 60/985,624 filed Nov. 5, 2007, and 60/985,627 filed Nov. 5, 2007, the contents of all of which are incorporated herein by reference.

FIELD OF THE INVENTION

The present invention relates to the field of photovoltaics (PV) technology that converts solar energy directly into electrical energy. More particularly, the present invention relates to optimizing material parameters of single-crystal silicon (mono-Si) wafers that are used to fabricate PV solar cells, as well as device structures of the solar cells in order to achieve maximum solar energy conversion efficiency, extracting more power of electricity from available solar irradiance.

BACKGROUND OF THE INVENTION

PV is a technology typically using large area p-n junction diodes to convert sunlight into electricity. These p-n junction diodes are therefore called solar cells. When a solar cell is exposed to the solar irradiance, photons from the sunlight that have energy greater than the band gap of the semiconductor material of which a cell is made create electron-hole pairs in the cell. The asymmetrical characteristics of the p-n junction determine the flow direction of the photo-generated carriers of different types contributing to the cell output that can be extracted from the cell's terminals, in a way similar to a normal electrochemical battery.

FIG. 1 illustrates a basic single p-n junction solar cell 100 made from a p-type substrate. Referring to FIG. 1, the solar cell 100 includes front contact fingers 102, an antireflection (AR) layer 104, an n+ layer 106, a p-type mono Si substrate 108, a back-side-field (BSF) p+ layer 110, and a rear metal contact 112. The n+ layer 106 covers the top or front surface of the substrate 108. The antireflection layer 104, which may be made of silicon nitride (SiNx), covers the entire surface of the n+ layer 106, and the front contact fingers 102 are spatially embedded in the antireflection layer 104. On the back side of the substrate 108, the p+ layer 110 covers the back surface of the substrate 108, and the back metal contact 112 covers the entire surface of the p+ layer 110. The antireflection layer 104 and the n+ layer 106 have a triangular wave shape to reduce reflection loss.

The theoretical energy conversion efficiency of a PV solar cell consisting of one p-n junction like the solar cell 100 in FIG. 1 is about 31%, which is the electricity power that can be extracted from the cell relative to the total solar irradiance into the cell. Solar cells can be made from various materials, but solar cells made from mono-Si are the most efficient in energy conversion, excluding the expensive compound semiconductor cells which are almost explicitly used for extraterrestrial applications. Mono-Si solar cells are generally fabricated on p-type Si substrates cutting from boron-doped (B-doped) single crystal ingots mainly produced by Czochralski (CZ) growth method. The CZ method is a much preferred method over another so-called floating-zone (FZ) method in the solar industry because of its capability of producing inexpensive, large-diameter single-crystal ingots with excellent strength. The energy conversion efficiency of mono-Si solar cells made from B-doped p-type substrates in massive production is typically limited to around 16-17% due to various loss mechanisms. One loss mechanism is due to the recombination of the photo-generated carriers caused by defects and impurities that adversely shorten the lifetime of the minority carriers in the p-type absorber region, in addition to the non-radiative recombination in he heavily doped n-type region and at its surface.

It is known that the lifetime of minority carriers (electrons) decreases drastically in B-doped p-type mono-Si wafers when the concentration of B dopants is slightly below or comparable to that of the background oxygen impurity resulting from the dissolution of silica crucible during CZ crystal growth. Solar cells made from the B-doped substrates generally exhibit a certain degree of degradation after subjecting to strong photo-illumination presumably caused by high concentration oxygen impurity interacting with B dopants, shortening the lifetime of electrons and therefore limiting the conversion efficiency.

Using gallium (Ga) doped p-type substrates is one way to overcome the problem. Ga-doped Si wafers are observed to have a much longer lifetime of minority carriers without showing photo-degradation effect. Fabrication using Ga-doped substrates in the same resistivity range as B-doped wafers yields solar cells consistently showing higher conversion efficiency compared to those using B-doped substrates. However, it is well known that Ga-doped single-crystal Si ingots grown by CZ method have very poor doping distribution uniformity in both axial and radial directions primarily due to the very small equilibrium segregation coefficient for Ga dopant in Si. Shown in FIG. 2 is a comparison of doping distributions as a function of the fraction of solidified melt between Ga and B dopants, where $C_o$ and $C_s$ are equilibrium concentrations of dopants in the solid and the liquidified melt, and the equilibrium segregation coefficients are 0.008 and 0.8 for Ga and B, respectively. The small equilibrium segregation coefficient for Ga dopant in Si crystal growth inherently poses a great challenge to the industry as how to obtain a uniform doping distribution throughout the entire CZ growth process. Even with controlling pull rate and rotation speed during the growth, large variation in resistivity from wafer to wafer resulting from non-uniform Ga doping distribution in Si ingots is still inevitable.

Recombination in the heavily doped diffusion region and at its surface is another major loss channel that impacts the conversion efficiency of mono-Si solar cells. In general, a more heavily doped region results in greater recombination since there is more Auger recombination present in the region. Addition of a surface passivation film, such as oxide, usually reduces the recombination at the surface, only partially resolving the problem.

Another loss mechanism in energy conversation efficiency is the shadowing effect of the front contact fingers. The shadowing effect of front contact fingers alone may cause a reduction in current density resulting from the coverage of a metal grid of the fingers on the front face of a cell that blocks about 4~5% of the sunlight incident onto the cell surface. To overcome this shadowing problem, Lammert and Schwartz proposed an interdigitated back contact structure thirty years ago (M. D. Lammert and R. J. Schwartz, IEEE Trans. Electron. Dev. 31, 337 (1977)). By placing both n+ and p+ diffused contact regions on the back of a cell, the shadowing effect can be avoided. The series resistance can be further lowered as well as a result that the metal contacts may take up almost entire back surface. So far, full backside contacted solar cells have only been successfully developed using n-type mono-Si. Using p-type mono-Si wafers to fabricate full backside contacted solar cells should be, in principle, more advantageous because the diffusion length of minority carriers in a p-type Si wafer is much longer. Unfortunately, the vastly available and the most used CZ grown B-doped p-type Si single crystal wafers were found to consistently exhibit a not-so-well-understood degrading behavior in the lifetime of minority carriers (electrons) after subjecting to strong photo-illumination, preventing cells fabricated using B-doped wafers from achieving high conversion efficiency. The consensus to the problem is that the phenomenon is most likely to be caused by the interaction of B dopants with oxygen impurity that were incorporated into the Si crystal during CZ growth, presumably forming B-O complex, resulting in the degradation of the effective lifetime of minority carriers and therefore limiting the cells' conversion efficiency. On the other hand, Ga-doped p-type mono-Si wafers do not have the problem. Much longer lifetime of minority carriers were observed in Ga-doped Si wafers with no photo-degradation effect. Solar cells fabricated using Ga-doped wafers in the same resistivity range as B-doped wafers have consistently shown to be of higher conversion efficiency in comparison with those using B-doped substrates. With the technology of CZ growth of Ga-doped Si being rapidly advanced, fabricating fully backside contacted solar cells using p-type Si wafers has become a reality in terms of achieving better cells with higher conversion efficiency and using less amount of expensive Si material per cell for its thinner cell structure.

SUMMARY OF THE INVENTION

In light of the difficulties of the background art, the inventor developed the present invention.

According to one aspect of the invention, a method for producing a backside contact of a single p-n junction photovoltaic solar cell is provided. The method includes the steps of: providing a p-type substrate having a back surface; providing a plurality of p+ diffusion regions at the back surface of the substrate; providing a plurality of n+ diffusion regions at the back surface of the substrate in an alternate pattern with the p+ diffusion regions; providing an oxide layer over the p+ and n+ regions; providing an insulating layer over the back surface of the substrate; providing at least one first metal contact at the back surface for the p+ diffusion regions; and providing at least one second metal contact at the back surface for the n+ diffusion regions.

According to another aspect of the invention, a method for fabricating a backside contact of a single p-n junction photovoltaic solar cell is provided. The method includes the steps of: providing a substrate having a back surface; providing a α-Si layer over the back surface; providing a layer of oxide; and providing a layer of metal over the back surface and the α-Si layer to form the backside contact.

According to another aspect of the invention, a method for fabricating a backside contact of a single p-n junction photovoltaic solar cell is provided, comprising the steps of: providing a substrate having a back surface; forming a layer of hydrogenated amorphous Si (α-Si:H) over the back surface using plasma enhanced chemical vapor deposition at a temperature between 100 and 120° C.; annealing the α-Si:H layer at a temperature between 200 and 300° C.; forming patterned Al or Al alloy areas on top of the α-Si:H layer; heat driving in the Al or Al alloy areas to alloy with the α-Si:H layer; and covering the α-Si:H layer with a layer of Al using physical vapor deposition to form the backside contact.

DETAILED DESCRIPTION OF THE PREFERRED EMBODIMENTS

Disclosed herein are schemes designed to achieve maximum solar conversion efficiency for electricity power extraction from solar cells made from mono-Si substrates.

To improve conversion efficiency of mono-Si solar cells made from p-type substrates, Ga-doped rather than B-doped wafers are used in order to suppress the influence of high concentration oxygen impurity, which is ubiquitous in CZ grown single-crystal Si ingots, on the performance of the solar cells. To obtain p-type mono-Si wafers doped by Ga, it is necessary to grow p-type single-crystal Si ingots with resistivity ranging from 0.1 to 10 Ω-cm using Czochralski method. Ga-doped melt sources may be prepared by mixing Ga dopant at concentrations of approximately from $1 \times 10^{17}$ to $2 \times 10^{19}$ atoms/cm$^3$ with Si. However, as previously mentioned, achieving uniform distributed doping concentration in Ga-doped Si ingots pulling by CZ method is very difficult. As a result, a small amount of B at a ratio less than one atomic percent relative to Ga concentration is needed to add into the Ga-doped melt source in order to obtain uniformly distributed doping concentration throughout the growth of a p-type single-crystal Si ingot with Ga doping. Co-doping a small amount of B with Ga helps pulling up high-quality Si single-crystal ingots using CZ growth technique in two ways: increasing the effective segregation coefficient that may significantly reduce dynamic range of varying pulling rate and rotation speed for controlling doping uniformity during growth, and increasing heat expansion coefficient of Ga-doped Si melt so that the temperature fluctuation of the melt at the interface of crystal growth leading to non-uniform distribution of dopants can be greatly reduced. The co-doping method of B and Ga is disclosed in U.S. Pat. No. 5,700,320, which is incorporated herein by reference. This approach has been demonstrated to be very effective in improving the uniformity of doping concentration in the ingots.

To fabricate a solar cell using p-type mono-Si wafer with resistivity ranging from 0.1 to 10 Ω-cm, both ends of the wafer may be subjected to a number of process steps to complete a functional cell structure. The surface of a solar cell that always faces the sun is the front end of a Si wafer, from where the sunlight is incident into the cell. The surface of the solar cell that does not face the sun is the backside or back surface.

Figure 1:
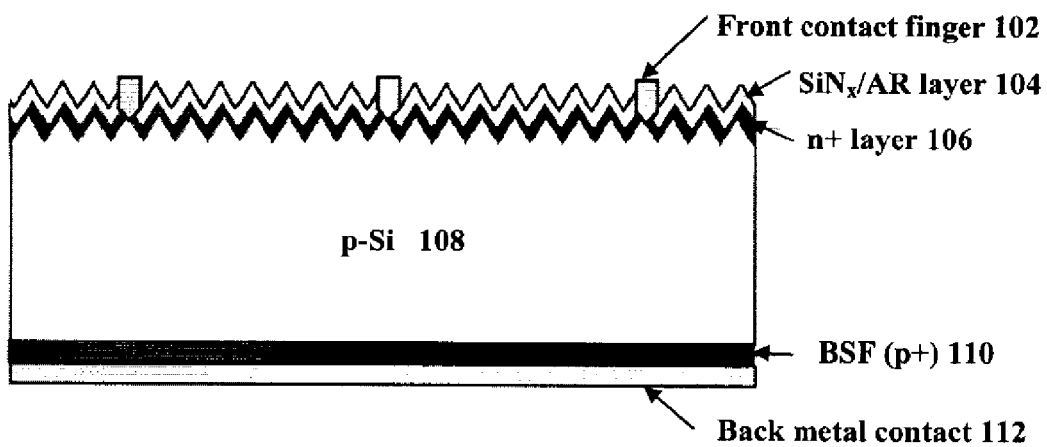
FIG. 1 is a Prior Art basic p-n junction solar cell made from a p-type substrate.
Figure 2:
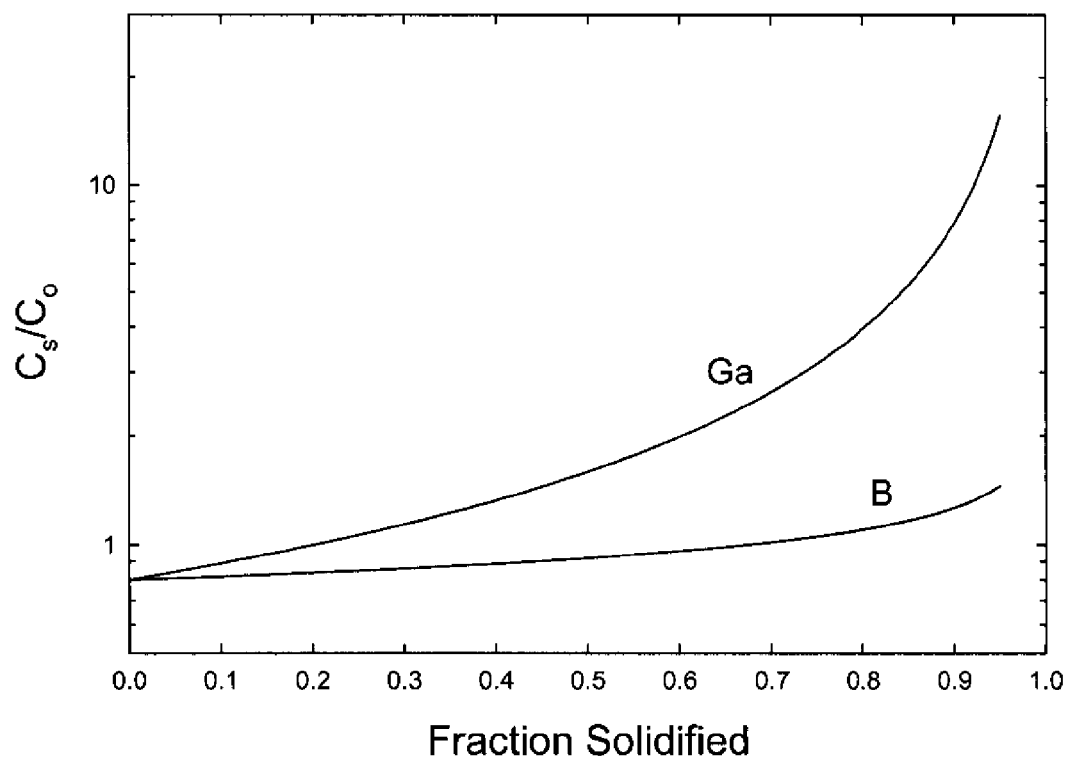
FIG. 2 is a graph for comparing doping distributions as a function of the fraction of solidified melt between Ga and B dopants.
Figure 3:
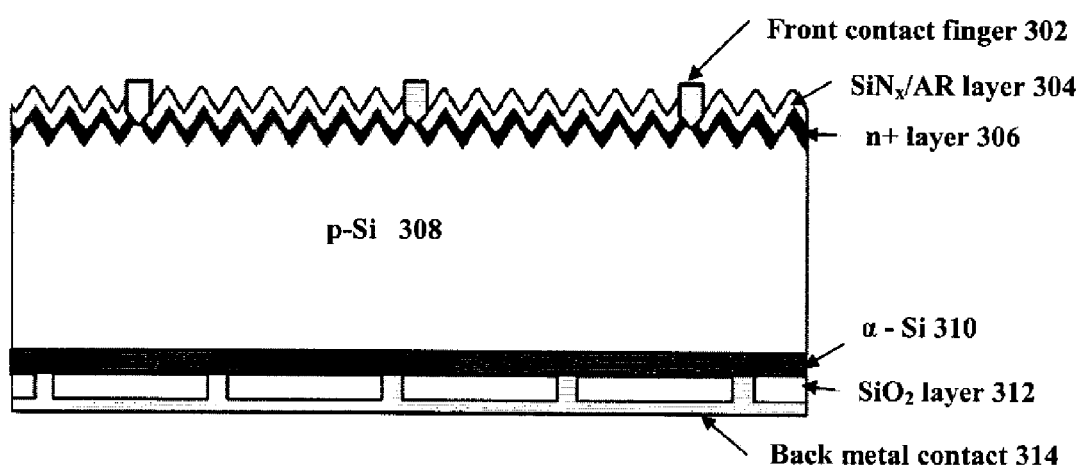
FIG. 3 is a structure of a solar cell fabricated on a Ga and B co-doped p-type mono-Si substrate according to an exemplary embodiment of the present invention.

FIG. 3 shows a solar cell 300 using a Ga and B co-doped substrate with resistivity ranging from 0.1 to 10 Ω-cm, according to an exemplary embodiment of the present invention. Referring to FIG. 3, the solar cell 300 includes front contact fingers 302, an antireflection layer 304 (SiNx/AR), an n+ layer 306 and a p-type mono-Si substrate 308, which are respectively similar to the front contact fingers 102, antireflection layer 104, the n+ layer 106 and the substrate 108 of Prior Art FIG. 1. The solar cell 300 of FIG. 3 does not have just the p+ layer 110 of FIG. 1. Instead, to improve the energy conversion efficiency over the prior art, the back surface of the substrate 308 in FIG. 3 is first covered by a thin layer of p-type amorphous Si (α-Si) 310. This α-Si layer 310 may be deposited by plasma enhanced chemical vapor deposition (PECVD) at a relatively low temperature (approximately 100° C.) and annealed at moderately higher temperatures (approximately between 200 and 300° C.). Aluminum (Al) is then evaporated onto the α-Si layer 310 through a shadow mask with openings in the dimensions from μm to sub-mm with separations in the order of mm to form a number of electrode pimples or stripes. A layer of oxide 312 (such as $SiO_2$) is thermally grown on top of the α-Si layer 310 in the areas that are not covered by the deposited Al. Finally, a thick layer 314 of Al is coated onto the entire wafer back surface using physical vapor deposition (PVD) to form a low-resistivity back contact. Such a back-contact formation process gets rid of the p+ diffusion BSF layer (such as the p+ layer 110 of FIG. 1), therefore eliminates the recombination loss in the heavily doped region. The α-Si layer 310 provides excellent surface passivation, resulting in a low recombination velocity for minority carriers. It also functions in a way similar to a BSF layer with its high conduction-band offset as a potential barrier confining minority carriers in the lightly doped base region, thus enhancing the spectral response at low photon energies of solar spectrum. The combination of the α-Si layer 310 and the oxide layer 312 followed by the Al contact layer 314 creates a high optical reflectance that enables more efficient light trapping compared to the reflection simply from Al back contact layer only.

For a full backside contacted solar cell, both n- and p-contacts are fabricated on the back end of its wafer. Accordingly, there is no metal grid of contact fingers on the front surface of the solar cell to shadow the incident sunlight. Described below (except for the embodiment of FIG. 3) are embodiments that lay out the process steps of fabricating n+ and p+ diffusion regions and contacts on the back end of a p-type Si wafer for making full backside contacted solar cells.

Figure 4:
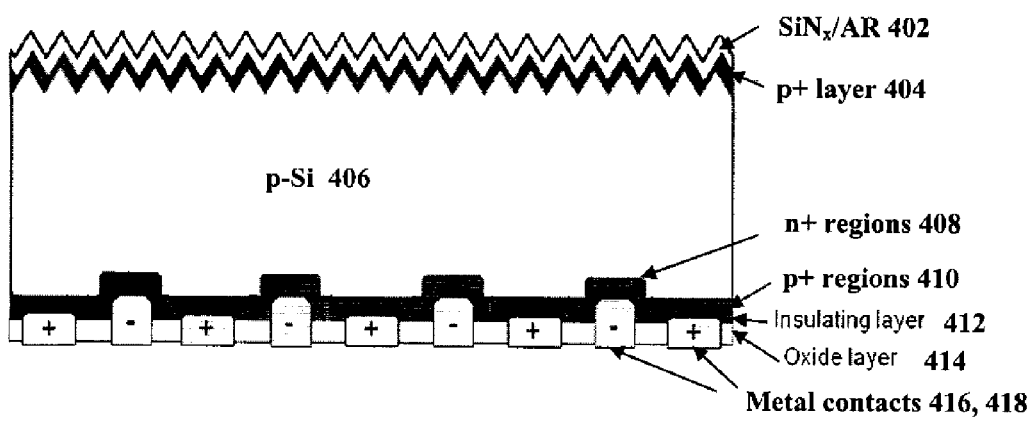
FIG. 4 is a structure of a solar cell fabricated on a Ga and B co-doped p-type mono-Si substrate, with both n+ and p+ contacts on the backside of the solar cell, according to another exemplary embodiment of the present invention.

FIG. 4 shows a solar cell 400 another exemplary embodiment of the present invention. Referring to FIG. 4, the solar cell 400 includes a SiNx or antireflection layer 402, a p+ diffusion layer 404, a p-type Ga and B co-doped mono-Si substrate 406 with resistivity ranging from 0.1 to 10 Ω-cm, an n+ diffusion regions 408, a p+ diffusion regions 410, an insulating layer 412, an oxide layer 414, n+ metal contacts 416, and p+ metal contacts 418. As shown in FIG. 4, the solar cell 400 includes both n- and p-contacts fabricated on the backside of the solar cell, which eliminates the shadowing effect caused by front contact finger grid. The n+ diffusion regions 408 are doped into the back surface of the substrate 406. The p+ diffusion regions 410 are deposited on the surface of the substrate 406 in an alternate or interweaved configuration with the n+ diffusion regions 408.

An exemplary method for fabricating the backside contact of the solar cell 400 in FIG. 4 may start with screen printing photoresist with etching patterns on the back surface of the substrate 406. Wet chemical etching is then used to selectively remove the patterned areas to form via holes 408 for n+ dopant deposition. P+ dopants are deposited on the back surface of the solar cell 400 to form p+ doping regions 410 in an alternate fashion with the n+ doping regions 408. Subsequently, an insulating layer 412 is provided to cover the entire back surface of the solar cell 400 and isolating the n+ doping regions 408 from the p+ doping regions 410. An oxide layer 414 is followed to cover the insulating layer 412. Metal contacts 416 are etched through the insulating layer 412 and the oxide layer 414 to be in contact with the n+ doping regions 408. Metal contacts 418 are also etched through the insulating layer 412 and the oxide layer 414 to be in contact with the p+ doping regions 410.

As shown in FIG. 4, both of the n+ and p+ diffused metal contacts 416 and 418 are placed on the back side of the solar cell 400. Since the metal contacts 416 and 418 may take up almost the entire back surface of the solar cell 400, the series resistance can be further lowered. Full backside contacted solar cells have only been successfully developed using n-type mono-Si. Using p-type mono-Si wafers to fabricate full backside contacted solar cells should be, in principle, more advantageous because the diffusion length of minority carriers in a p-type Si wafer is much longer. The light-induced degradation in the lifetime of minority carriers (electrons) has so far hindered the practice of fabricating fill backside contacted cells using CZ-grown B-doped p-type mono-Si wafers. Ga and B co-doped p-type mono-Si wafers do not have the problem and a much longer lifetime of minority carriers is expected. Therefore, fabricating fully backside contacted solar cells using this type of p-type Si wafers may achieve better performance with higher energy conversion efficiency and using less amount of expensive Si material per cell for it requires thinner cell structure.

Figure 5:
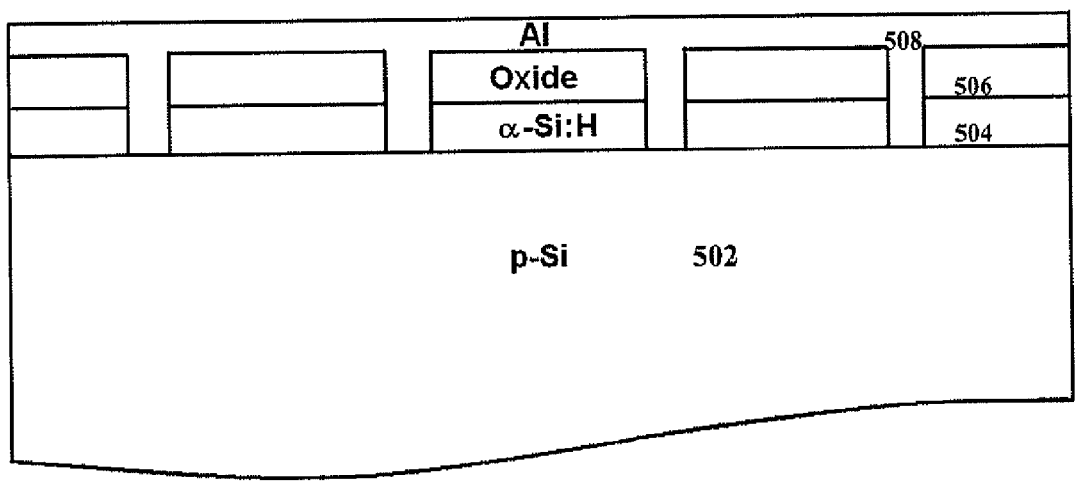
FIGS. 5-9 are structures of a backside of a solar cell fabricated on a Ga and B co-doped p-type mono-Si substrate according to various exemplary embodiments of the present invention.

FIG. 5 shows a backside of a solar cell 500 according to yet another exemplary embodiment of the present invention. Referring to FIG. 5, the back side of the solar cell 500 (shown upside down compared to the backside in FIG. 4) includes a p-type mono-Si substrate 502 with resistivity ranging from 0.1 to 10 Ω-cm, a hydrogenated amorphous Si (α-Si:H) layer 504 covering the substrate 502, a silicon dioxide ($SiO_2$) layer 506 covering the α-Si:H layer 504, and a low-resistivity metal (Al) back contact 508 covering the $SiO_2$ layer 506.

An exemplary method for fabricating the backside of the solar cell 500 may start with covering the back surface of the substrate 502 with a thin layer of the α-Si:H 504. This α-Si:H layer 504 may be deposited by, but not limited to, plasma enhanced chemical vapor deposition (PECVD) at a relatively low temperature (~100-120° C.), and may need to be annealed at moderately higher temperatures (~200-300° C.). A layer of the oxide $SiO_2$ 506 is then deposited onto the α-Si:H layer 504 using low-temperature CVD. After the growth of the $SiO_2$ layer 506, photoresist is to be screen printed with etching patterns to form a mask layer on the $SiO_2$ layer 506. Wet chemical etching is followed to selectively remove the unmasked oxide regions to form via holes for metal deposition afterwards. After removing the photoresist, a thick layer of Al or Al alloyed with other metals is deposited to fill those via holes, as well as cover the entire wafer back surface using physical vapor deposition (PVD), followed by heat drive in to form the low-resistivity back contact layer 508. Such a back-contact formation process may greatly reduce recombination loss at the surface and eliminate the loss in the heavily doped region. The α-Si:H layer 504 provides excellent surface passivation, resulting in a low recombination velocity for minority carriers. It also functions in a way similar to a BSF layer with its high conduction-band offset as a potential barrier confining minority carriers in the lightly doped base region, thus enhancing the spectral response at low photon energies of solar spectrum. The combination of the α-Si:H layer 504 and the oxide layer 506 followed by the Al back contact layer 508 creates a high optical reflectance that makes the cells to absorb light more efficient compared to the reflection simply from Al back contact layer only.

Figure 6:
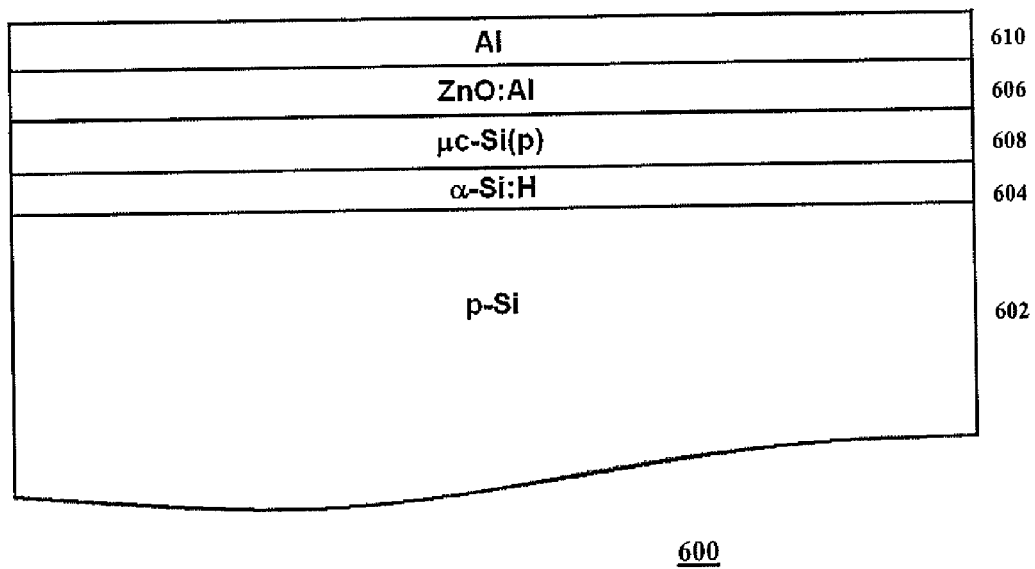

FIG. 6 shows a backside of a solar cell 600 according to yet another exemplary embodiment of the present invention. Referring to FIG. 6, the back side of the solar cell 600 includes a p-type mono-Si substrate 602 with resistivity ranging from 0.1 to 10 Ω-cm, a thin layer of hydrogenated amorphous Si (α-Si:H) 604 covering the back surface of the substrate 602, a layer of p-type microcrystalline silicon (μc-Si) 606 covering the α-Si:H 604 layer, a highly conductive Al-doped ZnO (ZnO:Al) layer 608 covering the μc-Si layer 606, and a thick layer of Al or Al-alloy contact layer 610 covering the ZnO:Al layer 608.

A method of manufacturing the solar cell 600 is as follows. In FIG. 6, the back surface of the substrate 602 is covered by a thin layer of hydrogenated amorphous Si (α-Si:H) 604. This α-Si:H layer 604 may be deposited by, but not limited to, plasma enhanced chemical vapor deposition (PECVD) at a relatively low temperature (~100-120° C.). A layer of p-type microcrystalline silicon (μc-Si) 606 is then deposited onto the α-Si:H layer 604 using PECVD at moderately higher temperatures (~200-240° C.). After the μc-Si deposition, a highly conductive Al-doped ZnO (ZnO:Al) layer 608 is to be deposited using PVD, followed by screen printing of a thick layer 610 of Al or Al alloy which covers the entire back surface of the solar cell 600. This process of forming a rear-contact on p-type mono-Si solar cell may greatly reduce recombination loss at the surface and eliminate the loss in the heavily doped region. The α-Si:H layer 604 provides excellent surface passivation, resulting in a low recombination velocity for minority carriers. It also functions in a way similar to BSF with its high conduction-band offset as a potential barrier confining minority carriers in the lightly doped base region, thus enhancing the spectral response at low photon energies of solar spectrum. The combination of the α-Si:H layer 604, the μc-Si layer 606, and the ZnO:Al layer 608, followed by the Al contact layer 610 acts as a high reflector that may produce better light trapping effect compared to the reflection simply from Al back contact layer only.

Figure 7:
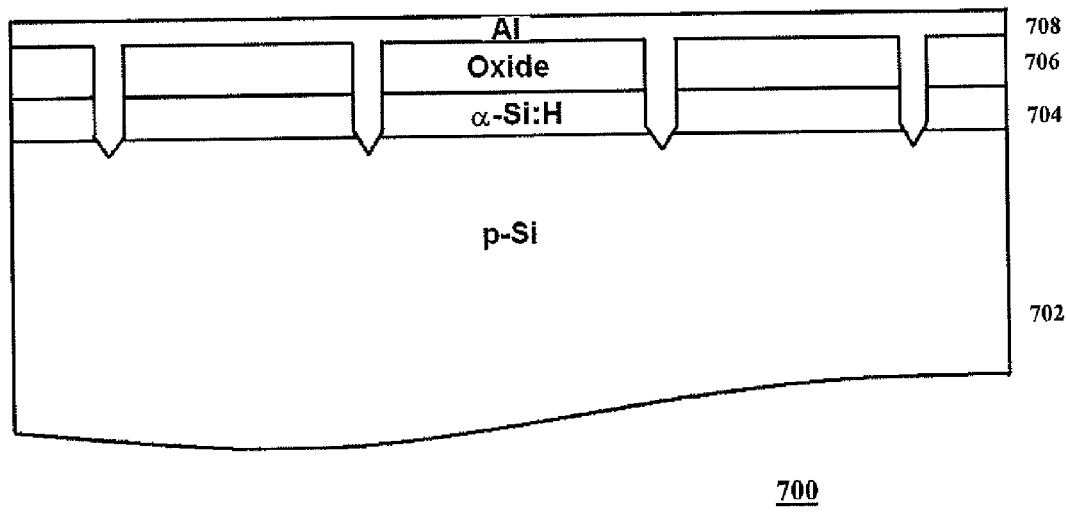

FIG. 7 shows a backside of a solar cell 700 according to yet another exemplary embodiment of the present invention. Referring to FIG. 7, the back side of the solar cell 700 includes a p-type mono-Si substrate 702 with resistivity ranging from 0.1 to 10 Ω-cm, a thin layer of hydrogenated amorphous Si (α-Si:H) 704, a layer of silicon dioxide ($SiO_2$) 706, and a metal back contact layer 708.

A method of manufacturing the solar cell 700 is as follows. The back surface of the substrate 702 in FIG. 7 is first covered by a thin layer of hydrogenated amorphous Si (α-Si:H) 704. This α-Si:H layer 704 may be deposited by, but not limited to, plasma enhanced chemical vapor deposition (PECVD) at a relatively low temperature (~100-120° C.), and may need to be annealed at moderately higher temperatures (~200-300° C.). A layer of silicon dioxide ($SiO_2$) 706 is then deposited onto the α-Si:H layer 704 using low-temperature CVD. After the growth of the $SiO_2$ layer 706, a laser beam may be fired onto the backside of the wafer covered by the α-Si:H and $SiO_2$ layers 704 and 706 to create via holes for forming metal contact. A thick layer of Al or Al alloyed with other metals may be deposited to fill those laser-drilled via holes, as well as cover the entire wafer back surface using physical vapor deposition (PVD), followed by heat drive in to form the low-resistivity back contact 708. Such a back-contact formation process may greatly reduce recombination loss at the surface and eliminate the loss in the heavily doped region. The α-Si:H layer 704 provides excellent surface passivation, resulting in a low recombination velocity for minority carriers. It also functions in a way similar to BSF with its high conduction-band offset as a potential barrier confining minority carriers in the lightly doped base region, thus enhancing the spectral response at low photon energies of solar spectrum. The combination of the α-Si:H layer 704 and the oxide layer 706 followed by the metal contact layer 708 may act as a high-reflectivity mirror stack that reflects the unabsorbed photons back and forth more efficiently compared to the reflection simply from Al back contact layer only.

Figure 8:
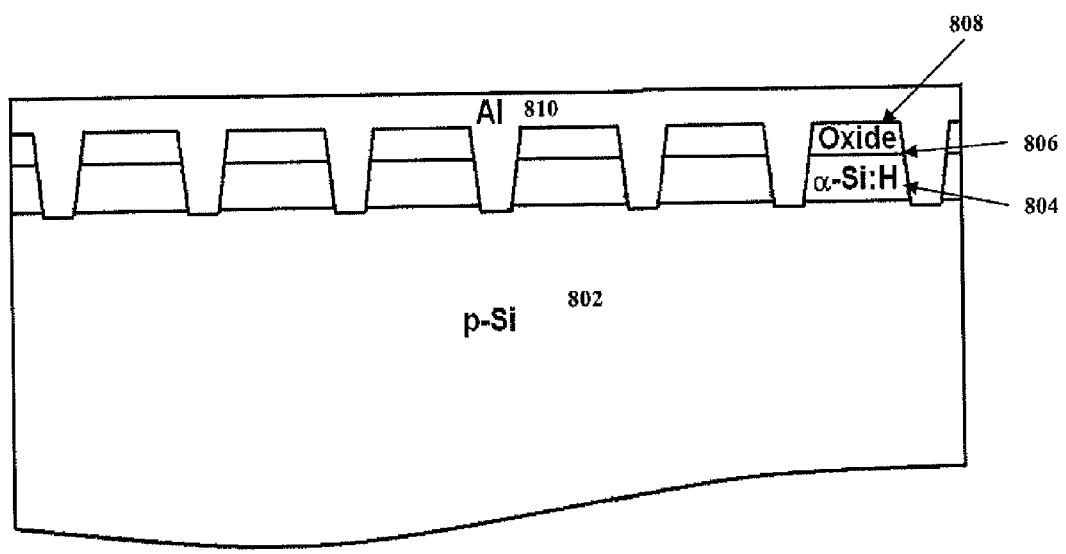

FIG. 8 shows a backside of a solar cell 800 according to yet another exemplary embodiment of the present invention. Referring to FIG. 8, the backside of the solar cell 800 includes a p-type mono-Si substrate 802 with resistivity ranging from 0.1 to 10 Ω-cm, a thin layer of hydrogenated amorphous Si (α-Si:H) 804, dots or stripes of patterned Al or Al alloy 806, a layer of silicon dioxide ($SiO_2$) 808, and a back contact layer 810. As described below, the patterned Al or Al alloy dots or stripes 806 are inkjet printed on top of the α-Si:H layer 804 prior to the deposition of the $SiO_2$ layer 806.

A method of manufacturing the solar cell 800 is as follows. The back surface of the substrate 802 in FIG. 8 is first covered by a thin layer of hydrogenated amorphous Si (α-Si:H) 804. This α-Si:H layer 804 may be deposited by, but not limited to, plasma enhanced chemical vapor deposition (PECVD) at a relatively low temperature (~100° C.). After it is annealed at moderately higher temperatures (~200-300° C.), patterned Al or Al alloy dots or stripes 806 may be inkjet printed on top of the α-Si:H layer 804. A $SiO_2$ layer 808 is immediately deposited over the α-Si:H layer 804 and the Al or Al alloy dots/stripes 806. After the deposition of the oxide is done, wet chemical etching may be carried out to reduce the thickness of the oxide as to uncover the Al or Al alloy dots/stripes 806. Then, a thick layer 810 of Al may be deposited to cover the entire wafer back surface using physical vapor deposition (PVD). Heat drive in is necessary to allow the Al dots/stripes to alloy with the underlying α-Si to form low-resistivity metallic contact. In this way, the process may greatly reduce recombination loss at the surface and eliminate the loss in the heavily doped region. The α-Si:H layer 804 provides excellent surface passivation, resulting in a low recombination velocity for minority carriers. It also functions in a way similar to BSF with its high conduction-band offset as a potential barrier confining minority carriers in the lightly doped base region, thus enhancing the spectral response at low photon energies of solar spectrum. The combination of the α-Si:H layer 804 and the oxide layer 806 followed by the metal contact layer 810 may act as a high-reflectivity mirror stack that reflects the unabsorbed photons back and forth more efficiently compared to the reflection simply from Al back contact layer only.

Figure 9:
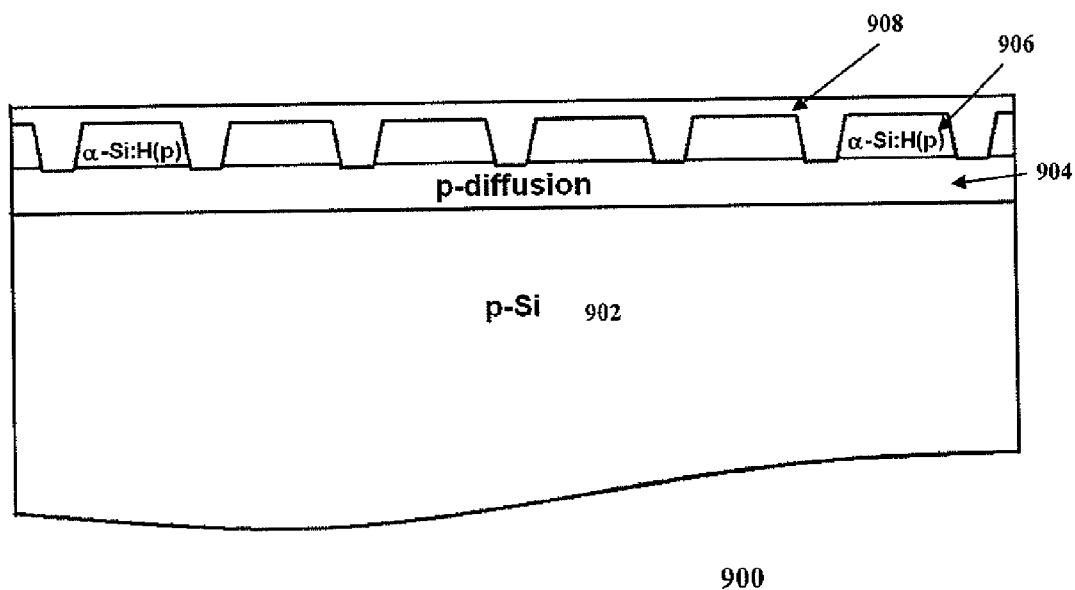

FIG. 9 shows a backside of a solar cell 900 according to another exemplary embodiment of the present invention. Referring to FIG. 9, the backside of the solar cell 900 includes a p-type mono-Si substrate 902 with resistivity ranging from 0.1 to 10 Ω-cm, a p-diffusion layer 904 covering the substrate 902, a thin layer of hydrogenated amorphous Si (α-Si:H) 906 covering the p-diffusion layer 904, patterned Al or Al alloy dots or stripes (not shown) inkjet printed on top of the α-Si:H layer 906, and a thick Al back contact layer 908 covering the back surface of the solar cell 900.

A method of manufacturing the solar cell 900 is as follows. Referring to FIG. 9, the back surface of the substrate 902 is doped with B to form a thin moderately doped p-diffusion layer 904 in the mid doping concentration range of $10^{18}/cm^3$. A thin layer of hydrogenated amorphous Si (α-Si:H) 906 is deposited over the p-diffusion layer 904. This α-Si:H layer 906 may be deposited by, but not limited to, plasma enhanced chemical vapor deposition (PECVD) at a relatively low temperature (~100° C.). After it is annealed at moderately higher temperatures (~200-300° C.), patterned Al or Al alloy dots or stripes (not shown) may be inkjet printed on top of the α-Si:H layer, followed by heat drive in to allow Al dots/stripes to alloy with the underlying α-Si to form low-resistivity point or stripe contact to the p-diffusion layer 904. Then, a thick layer 908 of Al may be deposited to cover the entire wafer back surface using physical vapor deposition (PVD). In this way, the process may greatly reduce recombination loss at the surface and eliminate the loss in the heavily doped region. The α-Si:H layer 906 provides excellent surface passivation, resulting in a low recombination velocity for minority carriers. It also functions in a way similar to BSF with its high conduction-band offset, together with the moderately doped p-diffusion layer 904, as a two-step potential barrier confining minority carriers in the lightly doped base region, thus enhancing the spectral response at low photon energies of solar spectrum.

Figure 10:
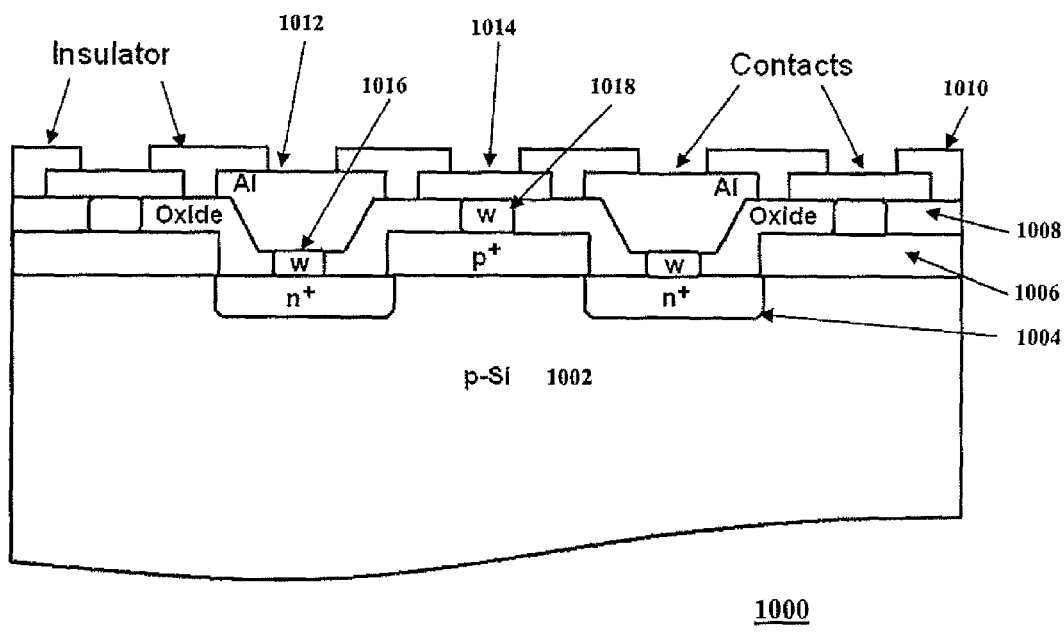
FIGS. 10-12 are structures of a solar cell that include both n+ and p+ contacts on the backside of the solar cell, according to other exemplary embodiments of the present invention.

FIG. 10 shows a backside of a solar cell 1000 according to another exemplary embodiment of the present invention. Referring to FIG. 10, the solar cell 1000 includes a p-type mono-Si substrate 1002 with resistivity ranging from 0.1 to 10 Ω-cm, n+ doping regions 1004 and p+ doping regions 1006 in the back of the solar cell 1000, an oxide layer 1008, an insulating layer 1010, low-resistivity metal contact regions 1012 connected to the n+ doping regions 1008 via Tungsten (W) regions 1016, and low-resistivity metal contact regions 1014 connected to the p+ doping regions 1006 via W regions 1018.

The process for fabricating the solar cell 1000 may start with diffusing p+ dopant into a clean back surface of a p-type mono-Si substrate 1002 using B as dopant to form a heavily diffused p+ layer 1006. Oxidization (layer 1008) may be required to cover the entire surface of the substrate 1002 for passivation. To make n+ contact on the same side of the substrate 1002, photoresist may be screen printed on to the oxide layer 1006 with finger-like patterns. The areas uncovered by the photoresist on the oxide layer 1006 and underneath p+ diffusion region 1006 may be chemically etched away to open channels for phosphorus (P) diffusion to form n+ regions 1004. After the n+ diffusion step, oxidization may be required to cover the entire wafer once again and followed by screen printing photoresist for patterning both n+ and p+ contact channels. Wet chemical etching removes the oxide to expose the n+ and p+ regions for metal deposition in order to form low-resistivity contacts. Tungsten (W) may be used to fill etched channels to form regions 1016 and 1018. Thereafter, Al or Al:Cu alloy may be used to cover the whole surface of the wafer to form low-resistivity metal back contacts 1012 and 1014. Photoresist may be screen printed once again with patterns for etching Al or Al:Cu alloy to isolate contacts to the n+ regions 1004 from those to the p+ regions 1006. After metal etching, a nitride insulator layer 1010 may need to cover the entire wafer area. Screen printing photoresist may be required one more time to provide final etching pattern. To complete the process, the contacts 1016 and 1018 of both polarities may be opened up using wet chemical to etch away uncovered insulator.

Figure 11:
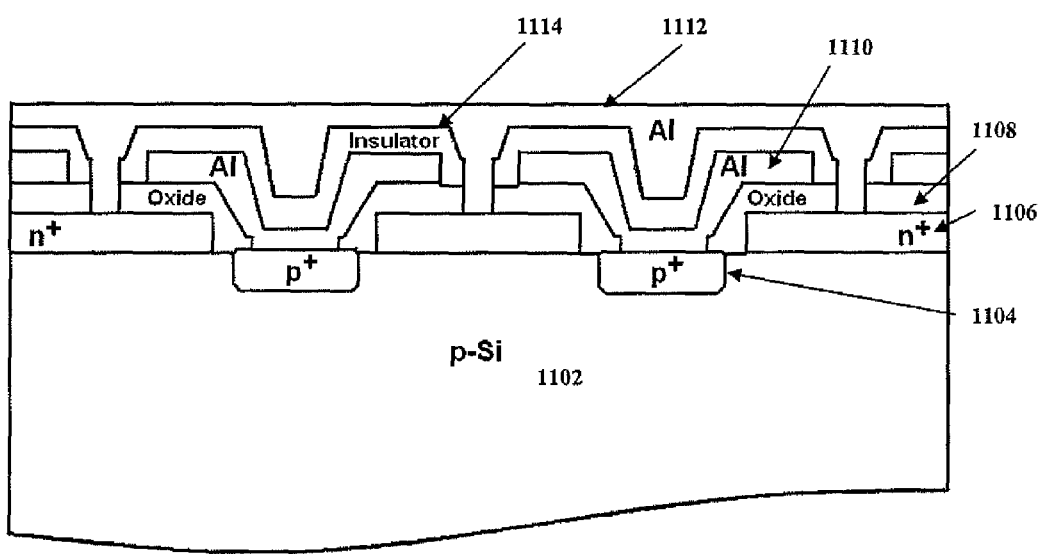

FIG. 11 shows a backside of a solar cell 1100 according to another exemplary embodiment of the present invention. Referring to FIG. 11, the solar cell 1100 includes a p-type mono-Si substrate 1102 with resistivity ranging from 0.1 to 10 Ω-cm, p+ diffusion regions 1104, n+ diffusion regions 1106, an oxide layer 1108, first low-resistivity metal (Al) contact regions 1110 for the p+ diffusion regions 1104, second low-resistivity metal (Al) contact regions 1112 for the n+ diffusion regions 1106, and an insulating layer 1114 for insulating the contact regions 1110 and 1112. The p+ diffusion regions 1104 are etched into the backside of the substrate 1102. The n+ diffusion regions 1106 are deposited on top of the backside of the substrate 1102, in an alternate or interweaved pattern with respect to the p+ regions 1104. The oxide layer 1108 acts as an insulator between the p+ regions 1104 and the n+ regions 1106.

Referring to FIG. 11, the process for fabricating the solar cell 1100 may start with diffusing phosphorus (P) into a clean surface of a p-type Si wafer or substrate 1102 to form a heavily n+ diffused layer 1106. To make p+ contacts 1104 on the same side of the substrate 1102, photoresist may be screen printed with finger-like patterns. The uncovered n+ diffusion region 1106 may be chemically etched away to open channels for p+ diffusion. After etching, a layer of oxide 1108 may be thermally grown to cover the entire surface of the wafer, followed by screen printing photoresist to form etching stripe patterns. After etching away uncovered oxide, deposition of Al or Al:Si alloy (layer 1110) may be carried out using screen printing or PVD to fill the opened channels and cover whole wafer surface. p+ diffusion may be accomplished by heat firing to drive in Al into Si to form heavily p-doped regions interweaved with those un-etched n+ regions (the gaps between the n+ regions 1106). Screen printing photoresist onto the metal coverage layer 1110 with etching spots over the n+ diffused regions 1106 is the next step to open via holes through the metal layer 1110. After etching the metal layer 1110, a nitride insulator layer 1114 may be deposited to cover the entire wafer surface, followed once by screen printing resist with the etching pattern similar to the previous one but smaller spots. The last wet chemical etching process removes both nitride and oxide layers (1108, 1114) to open via holes for contacts to the n+ regions 1106. Then a final metal deposition (layer 1112) takes place to fill those vial holes, as well as cover the entire surface. In this way, both p+ and n+ diffusion regions 1104 and 1106 are contacted with two electrode sheets almost the same size of the wafer, capable of providing excellent electrical conduction and heat dissipation.

Figure 12:
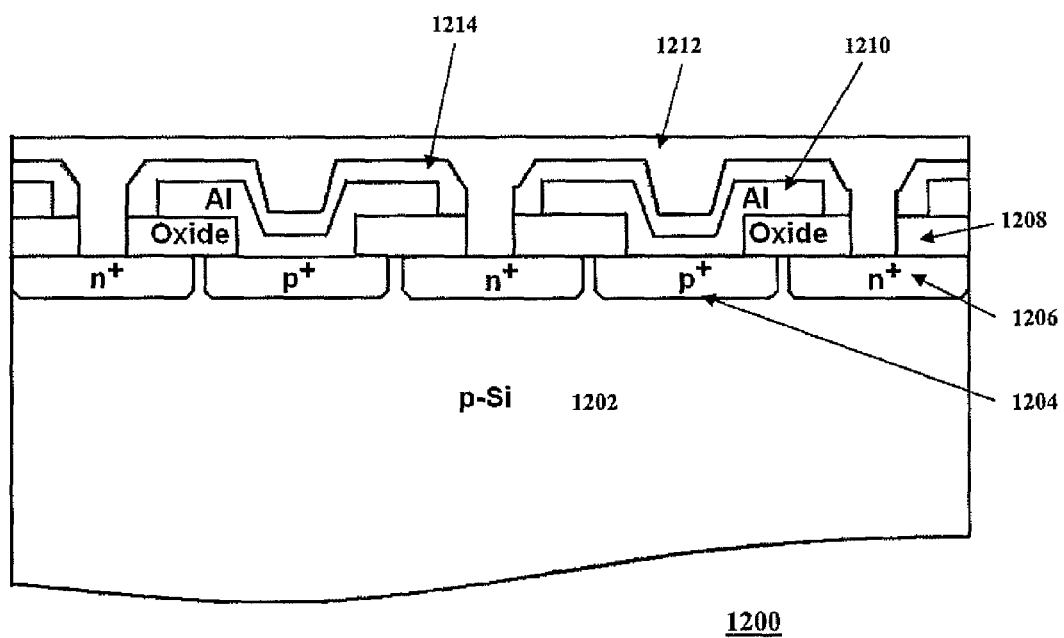

FIG. 12 shows a backside of a solar cell 1200 according to another exemplary embodiment of the present invention. Referring to FIG. 12, the solar cell 1200 includes a p-type mono-Si substrate 1202 with resistivity ranging from 0.1 to 10 Ω-cm, p+ diffusion regions 1204, n+ diffusion regions 1206, an oxide layer 1208, a first metal (Al) contact layer 1210 for the p+ diffusion regions 1204, a second metal (Al) contact regions 1212 for the n+ diffusion regions 1206, and an insulating layer 1214 for insulating the first contact layer 1210 and the second contact layer 1212. The p+ and n+ diffusion regions 1204 and 1206 are etched into the backside of the substrate 12102 in an alternate or interweaved pattern. The oxide layer 1208 acts as an insulator between the p+ regions 1204 and the n+ regions 1206.

Referring to FIG. 12, the process for fabricating the solar cell 1200 may start with inkjet printing dopant pastes of both n and p types using phosphorus silicate glass and boron silicate glass on the back surface of a p-type mono-Si substrate 1202 in an interweaved finger-like pattern, followed by firing to heat drive in forming $p^+$ and $n^+$ diffusion regions 1204 and 1206. Then a layer of oxide 1208 may be grown to cover whole wafer surface. To open via holes on the oxide layer 1208 for contact, photoresist may be screen-printed with etching pattern over $p^+$ diffusion regions 1204. Wet chemical may be used to etch the oxide layer 1208 to open via holes to $p^+$ regions 1204. Al or Al:Si alloy is deposited for $p^+$ contact using screen printing or PVD. A metal layer 1210 with Al or Al:Si is used to cover almost the entire wafer surface except for one edge of the wafer. Screen printing of photoresist with etching patterns over n$^+$ diffusion regions 1206 is then carried out to allow etch away uncovered areas of the metal layer 1210. A nitride insulator layer 1214 may be deposited to fill the vial holes and cover the rest of wafer surface after metal etching. Then photoresist with patterns similar to the previous etching for n$^+$ contact will be screen-printed on top of the insulator layer 1214. The final open via holes for contacts to the n+ diffusion regions 1206 may be etched through the nitride layer 114 and the oxide layer 1208 using wet chemical. After that, metal alloy making n$^+$ contact through via holes will be deposited. A second metal contact layer 1212 covers nearly the entire wafer surface except for the p$^+$ contact edge. Accordingly point contacts to both p+ and n+ diffusion regions 1204 and 1206 that are passivated by thermal oxide may provide very good electrical conduction to pull current out of the solar cell 1200 to the two electrode sheets almost the same size of the wafer, allowing excellent electrical conduction and heat dissipation.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A method for fabricating a backside contact of a single p-n junction photovoltaic solar cell, the method comprising the steps of:
   providing a substrate, the substrate having a front surface and a back surface and the substrate comprising a Ga and B co-doped p-type mono-Si;
   depositing a layer of p-type amorphous-Si on the back surface of said substrate to form an α-Si layer in contact with said substrate;
   forming metal contacts in direct contact with regions of said amorphous-Si layer;
   depositing a layer of oxide on the amorphous Si layer between said metal contacts; and
   providing a layer of metal over the back surface including the oxide layer to form the backside contact in contact with said metal contacts.

2. The method of claim 1, wherein the α-Si layer, the oxide layer, and the metal back contact are provided by:
   covering the back surface of the substrate with hydrogenated amorphous Si (α-Si:H) to form the α-Si layer;
   forming patterned Al or Al alloy stripes on top of the α-Si layer; heat-driving in the Al or Al alloy stripes to alloy with the α-Si layer;
   covering the α-Si layer with silicon dioxide to form the oxide layer;
   etching away parts of the oxide layer to uncover the Al or Al alloy stripes; and
   depositing a layer of Al to cover the back of the solar cell to form the metal back contact.

* * * * *